US 6,727,725 B2

(12) United States Patent
Devaney et al.

(10) Patent No.: US 6,727,725 B2
(45) Date of Patent: Apr. 27, 2004

(54) MOTOR BEARING DAMAGE DETECTION VIA WAVELET ANALYSIS OF THE STARTING CURRENT TRANSIENT

(75) Inventors: Michael J. Devaney, Hallsville, MO (US); Levent Eren, Columbia, MO (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/846,865

(22) Filed: May 1, 2001

(65) Prior Publication Data

US 2002/0186039 A1 Dec. 12, 2002

(51) Int. Cl.$^7$ ................. G01R 31/34; G01R 31/06; G01R 31/02
(52) U.S. Cl. ................. 324/772; 324/545; 324/72.5
(58) Field of Search ................. 324/772, 545, 324/725; 318/245, 490; 702/34, 56, 54

(56) References Cited

U.S. PATENT DOCUMENTS

| | | | | |
|---|---|---|---|---|
| 4,377,784 A | * | 3/1983 | Saito et al. | 324/772 |
| 4,509,088 A | * | 4/1985 | Profio | 361/29 |
| 4,965,513 A | * | 10/1990 | Haynes et al. | 324/772 |
| 5,030,917 A | * | 7/1991 | Kliman | 324/772 |
| 5,574,387 A | * | 11/1996 | Petsche et al. | 324/772 |
| 5,578,937 A | * | 11/1996 | Haynes et al. | 324/772 |
| 5,629,870 A | * | 5/1997 | Farag et al. | 324/558 |
| 5,689,194 A | * | 11/1997 | Richards et al. | 324/772 |
| 5,726,905 A | * | 3/1998 | Yazici et al. | 324/772 |
| 5,790,694 A | * | 8/1998 | Maruo | 382/149 |
| 5,995,910 A | * | 11/1999 | Discenzo | 702/56 |
| 6,326,758 B1 | * | 12/2001 | Discenzo | 318/609 |

FOREIGN PATENT DOCUMENTS

WO WO02089305 A1 * 11/2002 ........... H02P/1/00

OTHER PUBLICATIONS

"Bearing Defect Detection Using DDS and Wavelet Methods," Pandit, Sudhakar M. et al., *Symposium on Mechatronics*, DSC–vol. 50/PED–vol. 63, ASME 1993.
"Motor Bearing Damage Detection Via Wavelet Analysis of the Starting Current Transient," Eren, Levent et al., *IEEE Instrumentation and Measurement Technology Conference*, Budapest, Hungary, May 21–23, 2001.
"Motor Bearing Damage Detection Using Stator Current Monitoring," Schoen, Randy R., et al., *IEEE Transactions on Industry Applications*, vol. 31, No. 6, Nov./Dec. 1995.
"Power Quality Assessment Via Wavelet Transform Analysis," Powers, Edward J., *IEEE Transactions on Power Delivery*, vol. 11, No. 2, Apr. 1996.
"Power Measurement Using the Wavelet Transform," Yoon, Weon–Ki et al., *IEEE Transactions on Instrumentation and Measurement*, vol. 47, No. 5, Oct. 1998.
"Powerlogic® Advanced Power Reliability Solutions," Square D Schneider Electric, brochure, 2000, 3 pages dobulesided.
"Powerlogic® Circuit Monitor—Series 2000,", Square D Schneider Electric, brochure, 3 pages doublesided.
"Powerlogic® Metering & Monitoring Devices," Square D Schneider Electric, brochure, 2000, 2 pages doublesided.
"Powerlogic® Power Meter,", Square D Schneider Electric, brochure, 1998, 2 pages doublesided.

(List continued on next page.)

Primary Examiner—Kamand Cuneo
Assistant Examiner—Jermele Hollington
(74) Attorney, Agent, or Firm—Larry I. Golden

(57) ABSTRACT

An apparatus and method for detecting motor bearing defects obtains motor current transient data during motor start-up, analyzes the motor current transient data via discrete wavelet transform, and compares the wavelet subbands to a baseline signature of a bearing-defect-free motor to detect bearing defects.

22 Claims, 9 Drawing Sheets

OTHER PUBLICATIONS

"Powerlogic® Power Monitoring and Control System," Square D Schneider Electric, brochure, 1998, 4 pages doublesided.

"Powerlogic® Series 4000 Circuit Monitor," Square D Schneider Electric, brochure, 2000, 3 pages doublesided.

"Powerlogic® Solutions," Schneider Electric, brochure, 2000, 3 pages doublesided.

"Powerlogic® System Architecture and Application Guide," Schneider Electric, Data Bulletin, 3000DB0001, May 2000.

*Subband and Wavelet Transforms Design and Applications*, edited by Akansu, Ali N. and Smith, Mark J. T., Kluwer Academic Publishers, copyright 1996, cover through chapter 2.

* cited by examiner

MOTOR BEARING DAMAGE DETECTION VIA WAVELET ANALYSIS OF THE STARTING CURRENT TRANSIENT

FIELD OF THE INVENTION

This invention is directed generally to predictive maintenance and more particularly to detection of motor bearing faults.

BACKGROUND OF THE INVENTION

Induction machines are called the workhorses of industry due to their widespread use in manufacturing. The heavy reliance of industry on these machines in critical applications makes catastrophic motor failures very expensive. Vibration, thermal, and acoustic analyses are some of the commonly used methods, for predictive maintenance, to monitor the health of the machine to prevent motor failures from causing expensive shut-downs. Preventive maintenance of induction motors plays an important role in avoiding expensive shut-downs due to motor failures. Vibration and thermal monitoring require additional sensors or transducers to be fitted on the machines. While some large motors may already come with vibration and thermal transducers, it is not economically or physically feasible to provide the same for smaller machines.

Continuous monitoring with expensive analyzers may not be feasible, so that motors are checked periodically by technicians moving portable equipment from machine to machine on a maintenance schedule. The migration of multi-function circuit monitors from the principal feeders toward individual loads has propelled a study of the relationship of bearing vibration to the stator current. Current monitoring provides a non-intrusive approach to continuously monitor motor reliability with minimal additional cost.

Motor current signature analysis (MCSA) provides a non-intrusive way to obtain information about bearing health using already available line current. MCSA gets bearing information by relating the current spectral frequencies to characteristic vibration frequencies. Vibration signals from a defective bearing often consist of a superposition of normal bearing noise and the impulse response due to the defects. The characteristic vibration frequencies are calculated using rotor speed and the bearing geometry. MCSA investigates steady state data and utilizes the Fourier Analysis as the primary frequency domain method in determining bearing related spectral components.

Presently, motor current signature analysis techniques cannot detect bearing faults until the bearing fault reaches advanced stages. This increases the risk of a catastrophic failure.

Presently available motor current signature analysis techniques concerned with bearing fault diagnosis use the motor current data collected under steady state conditions. In steady state, the frequency components of motor current caused by bearing faults are very small compared to the rest of the current spectrum. Due to the large difference between current spectrum bearing harmonics and the rest of the current spectrum, it is much more difficult to detect bearing harmonics in the current spectrum.

In this invention, the starting current transient of an induction motor is analyzed via discrete wavelet transform to detect bearing faults. The frequency sub-bands for bearing pre-fault and post-fault conditions are compared to identify the effects of bearing/machine resonant frequencies as the motor starts. Using starting current transient analysis via discrete wavelet transform, the motor bearing faults are detected at an earlier stages so that bearing replacement can be scheduled and down time can be minimized.

SUMMARY OF THE INVENTION

Briefly, in accordance with the foregoing, a method for detecting motor bearing defects comprises obtaining motor current transient data during motor start-up, and analyzing the motor current transient data to detect changes in RMS levels due to bearing defect-induced resonance.

In accordance with another embodiment of the invention, an apparatus for detecting motor bearing defects comprises means for obtaining motor current transient data during motor start-up, and means for analyzing the motor current transient data to detect changes in RMS levels due to bearing defect-induced resonance.

DETAILED DESCRIPTION OF THE ILLUSTRATED EMBODIMENT

Figure 1:
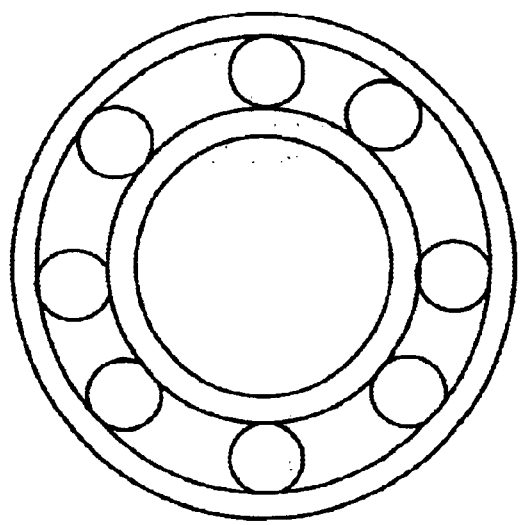
FIG. 1 shows a rolling element bearing geometry.

The relationship of bearing vibration to stator current spectrum results from the fact that any air gap eccentricity produces anomalies in the air gap flux density. The characteristic vibration frequencies due to bearing defects can be calculated given that the speed and the bearing dimensions are available. The typical rolling element bearing geometry is displayed on FIG. 1.

The characteristic vibration frequencies can be calculated using equations 1–5. In the following equations, $\phi$ is the contact angle in radians and $f_{rm}$ is the rotor speed in Hz. Outer race defect frequency $f_{OD}$, the ball passing frequency on the outer race, is given by $$f_{OD} = n/2 f_{rm}(1 - BD/PD \cos\phi) \tag{1}$$

Inner race defect frequency $f_{ID}$, the ball passing frequency on the inner race, is given by $$f_{ID} = n/2 f_{rm}(1 + BD/PD \cos\phi) \tag{2}$$

Ball defective frequency $f_{BD}$, the ball spin frequency is given by $$f_{BD} = PD/2BD(1 - (BD/PD)^2 \cos^2\phi) \tag{3}$$

Train defect frequency $f_{TD}$, caused by irregularity in the train, is given by $$f_{TD} = 1/2 f_{rm}(1 - BD/PD \cos\phi) \tag{4}$$

The characteristic current frequencies $f_{CF}$ due to bearing characteristic vibration frequencies are calculated by [1]

$$f_{CF} = |f_e \pm m f_v| \tag{5}$$

where $f$ is the power line frequency.

The equations 1–5 can be used to calculate the current harmonics due to faulty bearings. These components are very small compared to harmonic multiples of the power frequency and are thus difficult to detect.

In this invention, an alternate approach, the analysis of the starting current transient signal, is proposed. This analysis is performed via the discrete wavelet transform. The wavelet transform provides better performance in transient analysis than the Fourier transform. The frequency sub-bands for bearing pre-fault and post-fault conditions are compared to identify the effects of bearing/machine resonant frequencies as the motor starts.

As the motor starts, it will go through the whole range of speeds from stopped to its operating speed. This range includes critical speeds where the bearing induced vibrations are more pronounced because of mechanical resonances. The higher vibration magnitude at these speeds makes the detection of bearing faults easier. The starting current transient of an induction machine is analyzed via discrete wavelet transform and the magnitudes of frequency sub-bands are compared to the baseline data collected with a healthy set of bearings to detect any changes in bearing condition. The greatest magnitude deviation from the baseline data occurs at critical speeds when faulty bearing condition exists.

Figure 10:
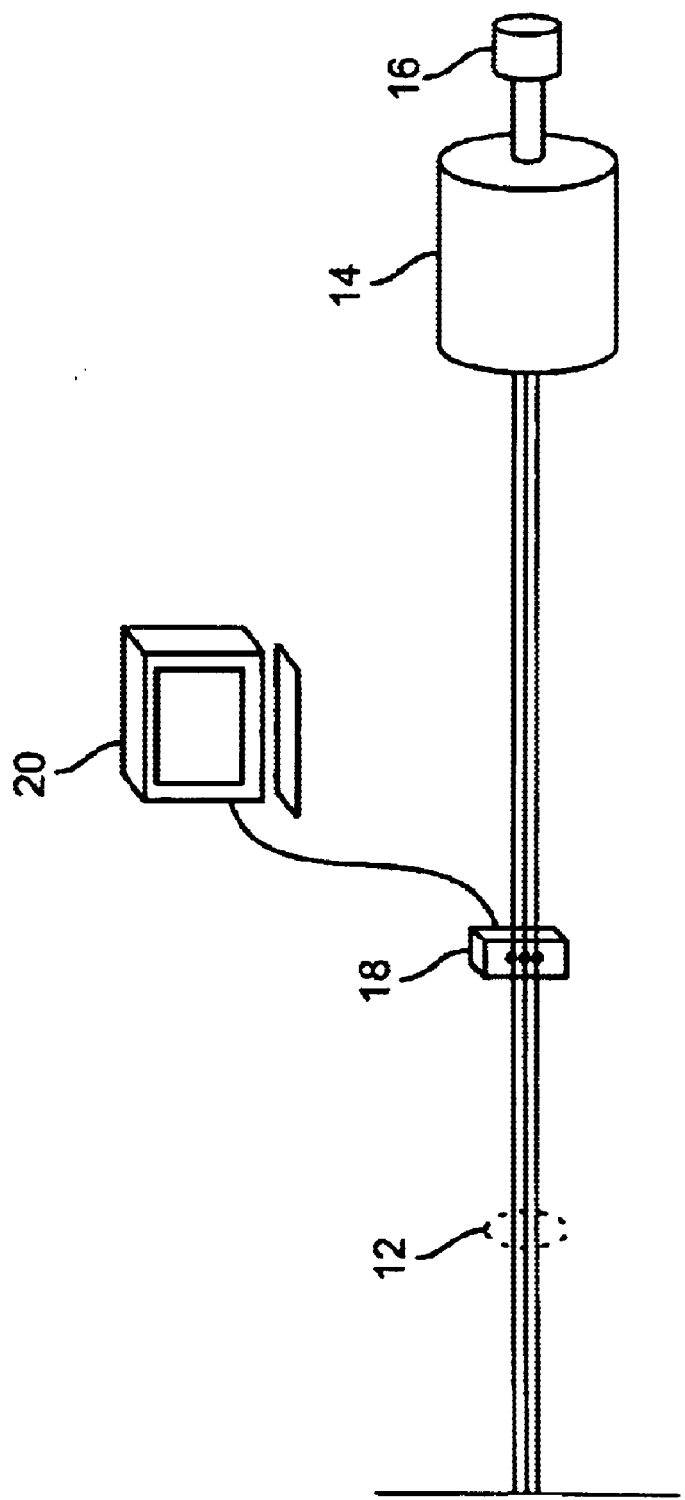
FIG. 10 shows a diagrammatic view of a motor in an environment as described by the present invention.

The working and test environment of the instant invention is shown in FIG. 10, which shows the induction motor 14 powered by a three-phase power source 10 over a power distribution network 12. The starting current transient of the motor 14 attached to a load 16 is captured using a conventional circuit or power monitor 18. In the present invention, the current wave of a single phase is sampled at 512 points per cycle for 60 cycles using the Waveform Capture™ feature of a Square D CM4000 series monitor 18 to capture the data for analysis. In this context, the Waveform Capture™ feature is triggered by a high speed overcurrent alarm. Then, the data is transferred to a PC 20 where this data is analyzed using a matlab program running a wavelet transform algorithm which decomposes the captured signal into its wavelet subbands. After the decomposition of the signal into its subbands, the magnitudes of the selected subbands are compared to the baseline data to detect any changes in bearing condition.

One principal advantage of this approach is that is does not require access to the machine itself as the vibration based bearing monitors do.

Thus a machine operating in the containment building of a nuclear reactor, for example, could be routinely checked by analyzing its starting current. If a problem began to appear its use could be reduced so that it could be used in a standby capacity until the next scheduled outage.

Figure 2:
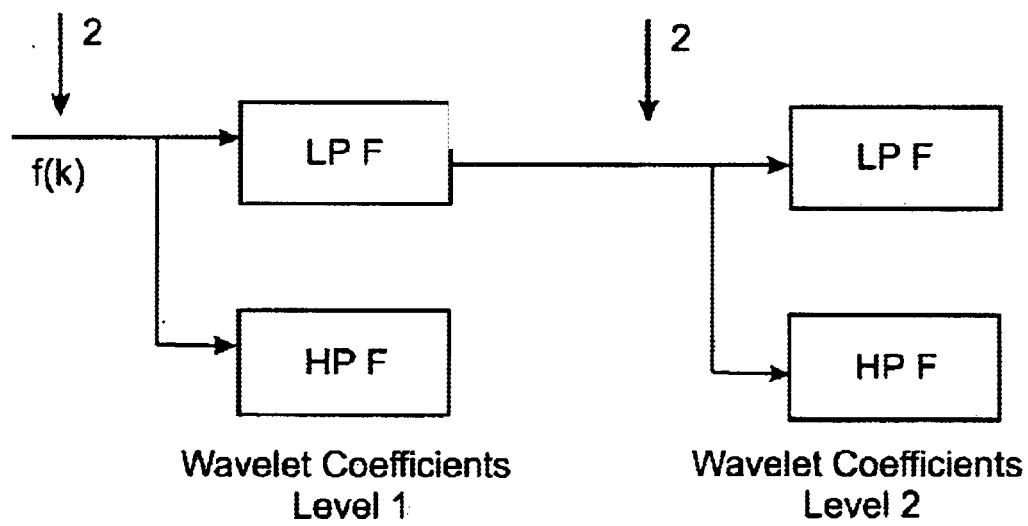
FIG. 2 illustrates an analysis of part of a dyadic filter bank.

The wavelet transform has been shown to be an effective tool for the analysis of both transient and steady state power system signals, as discussed for example in "Power Quality Assessment Via Wavelet Transform Analysis," S. Santoso et al. and "Power Measurement Using the Wavelet Transform," W. Yoon et al. FIG. 2 depicts the basic structure of the dyadic filter banks employed in discrete wavelet transform.

Figure 3:
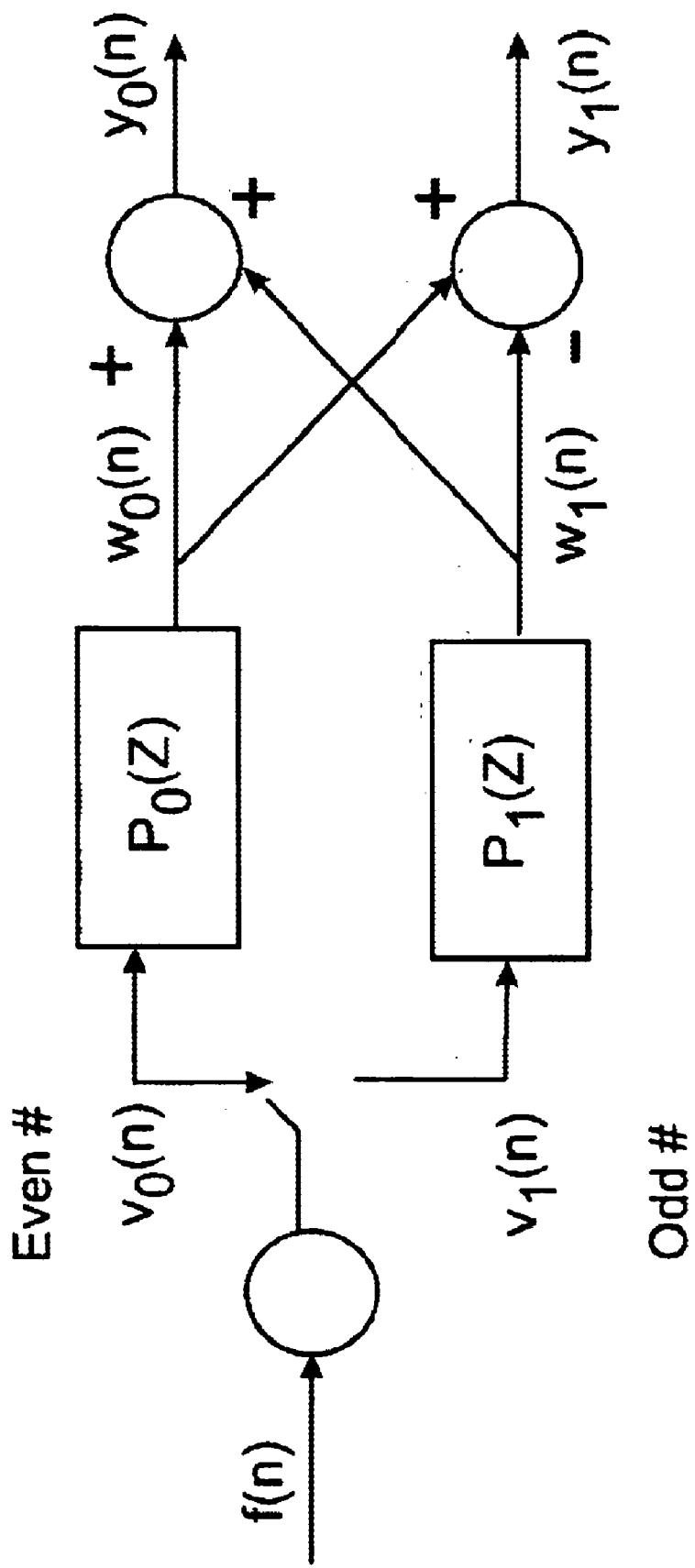
FIG. 3 shows a two channel polyphase filter structure.

Digital Butterworth, Chebyshev and elliptic filters obtained from the classical analog filters via the bilinear transformation can be designed as two-channel filter banks composed of allpass filters. IIR Butterworth, L=6, filters were implemented as allpass polyphase filter banks. The two channel polyphase filter structure used is shown in FIG. 3. The allpass polyphase filter banks result in less computational complexity than that of the original Butterworth filter banks. Therefore, using the filter bank in FIG. 3 instead the one in FIG. 2 reduces the computational effort. The IIR filters are chosen for their better frequency selectivity and lower computational complexity over their FIR counterparts.

A three phase, 1 hp, 200 V, 60 Hz, 1750 RPM, four-pole induction motor was used (US Motors Frame 143T). The shaft end ball bearing is a 6205-2Z-J/C3 (9 balls) and the opposite end ball bearing is a 6203-2Z-J/C3 (9 balls). In order to create a known defect in the bearing, a single 1.5 mm diameter hole was drilled in the outer race of the opposite end bearing.

Figure 4:
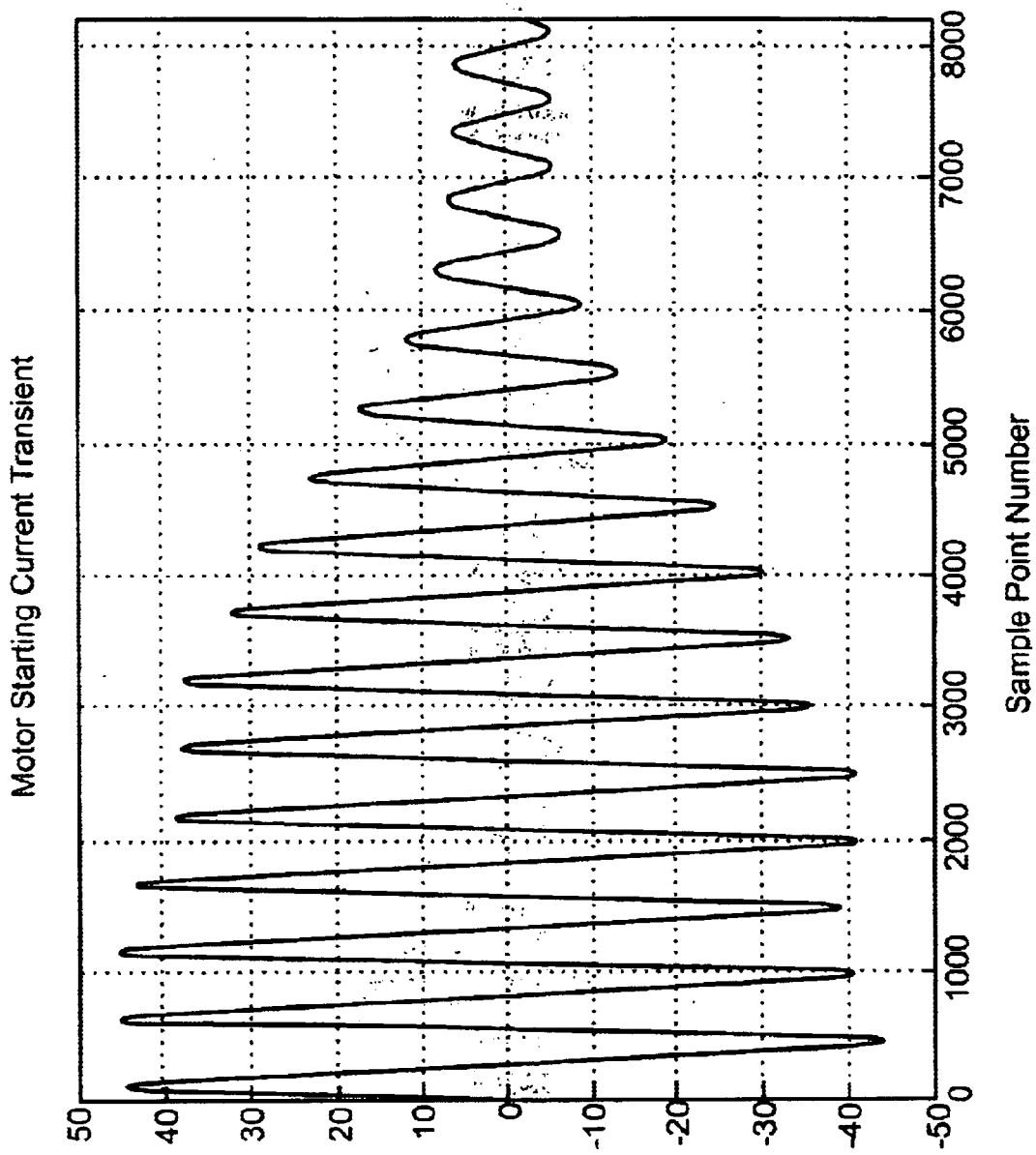
FIG. 4 shows a motor start transient current under ½ hp load.

Two different tests were performed to determine the effect of a faulty bearing when the motor was started from 208V, 60 Hz. The induction motor start-up current transient was captured at 512 points per cycle for 60 cycles using a Square D series 4000 Circuit Monitor. Captures were obtained at 50% of rated steady-state load before and after the fault was introduced. The first 16 cycles of phase A current are plotted in FIG. 4.

The current transient data were then analyzed to gain the bearing status information via the wavelet transform. Pre-fault and post-fault bearing current signals were compared under the start-up transient conditions. The wavelet frequency sub-bands, which convey both temporal and spectral relations, were compared to detect changes in the RMS levels due to bearing-defect induced resonance under start-up. Table 1 shows the wavelet levels and associated coefficient numbers and frequency bands obtained by the analysis of the data. Levels 3–6 were found to be more sensitive to the bearing defects.

TABLE 1

Wavelet Levels, Number of Coefficients and Frequency Bands

| Level | # of Coefficients | Frequency Band |
|---|---|---|
| 8 | 256 | 7680~15360 Hz |
| 7 | 128 | 3840~7680 Hz |
| 6 | 64 | 1920~3840 Hz |
| 5 | 32 | 960~1920 Hz |
| 4 | 16 | 480~960 Hz |
| 3 | 8 | 240~480 Hz |
| 2 | 4 | 120~240 Hz |
| 2* | 4 | 0~120 Hz |

Figure 5:
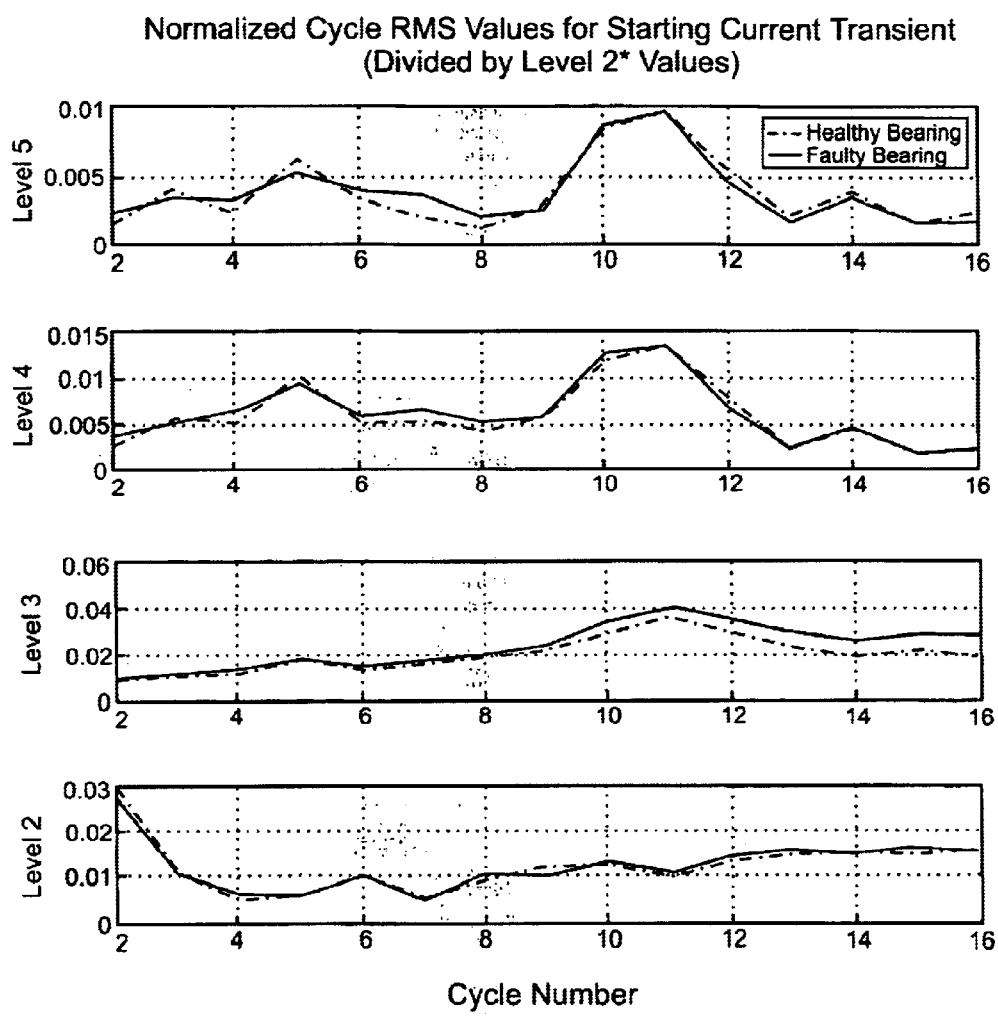
FIG. 5 shows a normalized current rms values for half load in the example of FIG. 4.

FIG. 5 Indicates the results of the transient wavelet analysis for the pre-fault and post-fault conditions. In each case, three trials were average and the plotted values were normalized by 0~120 Hz frequency bands at each cycle. Because of the relative dominance of the 60 Hz fundamental, the lowest sub-band of 0~120 HZ is not depicted. A comparison of the two plots indicates a substantial difference at the $11^{th}$ cycle for the 240~480 Hz frequency band in FIG. 5. The motor reaches the critical speed in this cycle relative to the defect.

Figure 6:
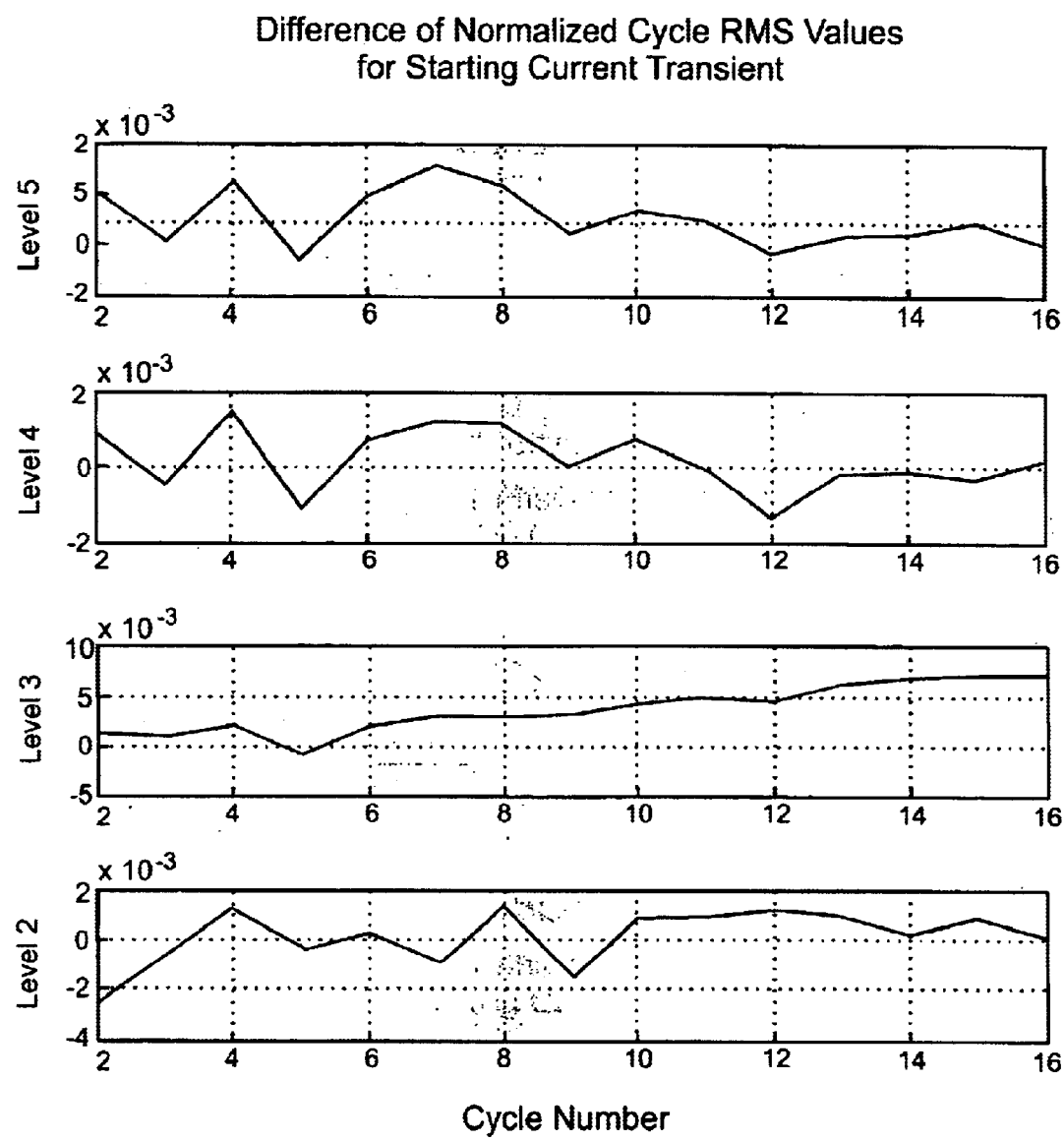
FIG. 6 shows the difference of normalized current rms values in the example of FIG. 4.

The difference of the normalized RMS values are plotted in FIG. 6. Basically, the normalized healthy bearing current RMS values are subtracted from the normalized faulty bearing current RMS values to obtain this plot.

In the second test, radial tension was applied to the motor running under no load. Again, the induction motor start-up current transient was captured, at 512 points per cycle for 60 cycles, using a Square D series 4000 Circuit Monitor at no load before and after the fault was introduced.

Figure 7:
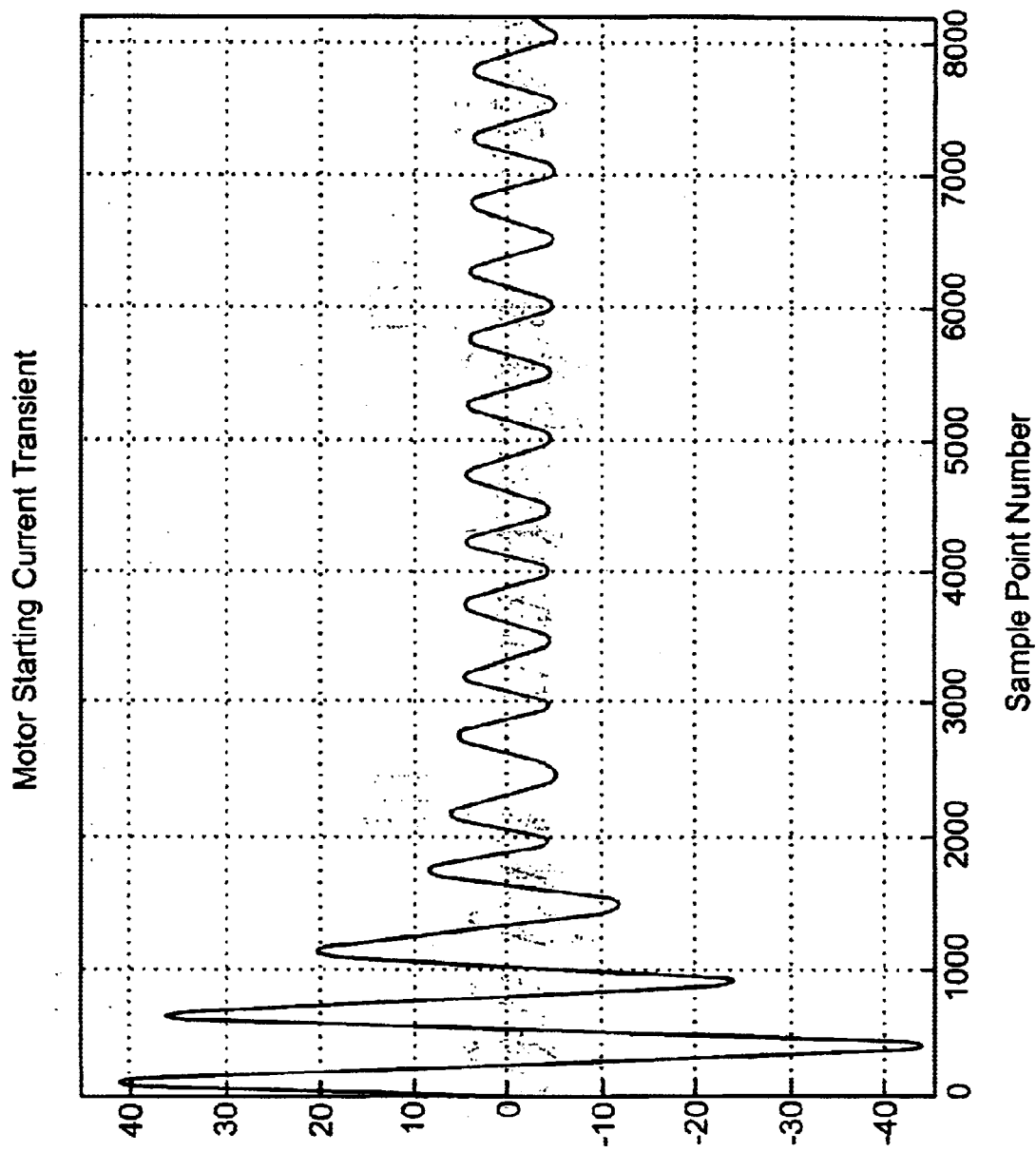
FIG. 7 shows a motor start transient current under no load.

The motor start transient current is plotted in FIG. 7. Comparing starting transients for half load and no load conditions, the motor reaches critical speed faster under no load condition. The point of critical speed can be assessed by examining the ratio of cycle RMS to steady state RMS under different loading conditions. By such an examination, the test engineer can determine the best range of wavelet frequency sub-bands to monitor to detect motor bearing defects. For the example used in this embodiment the ratio is about 2X.

Figure 8:
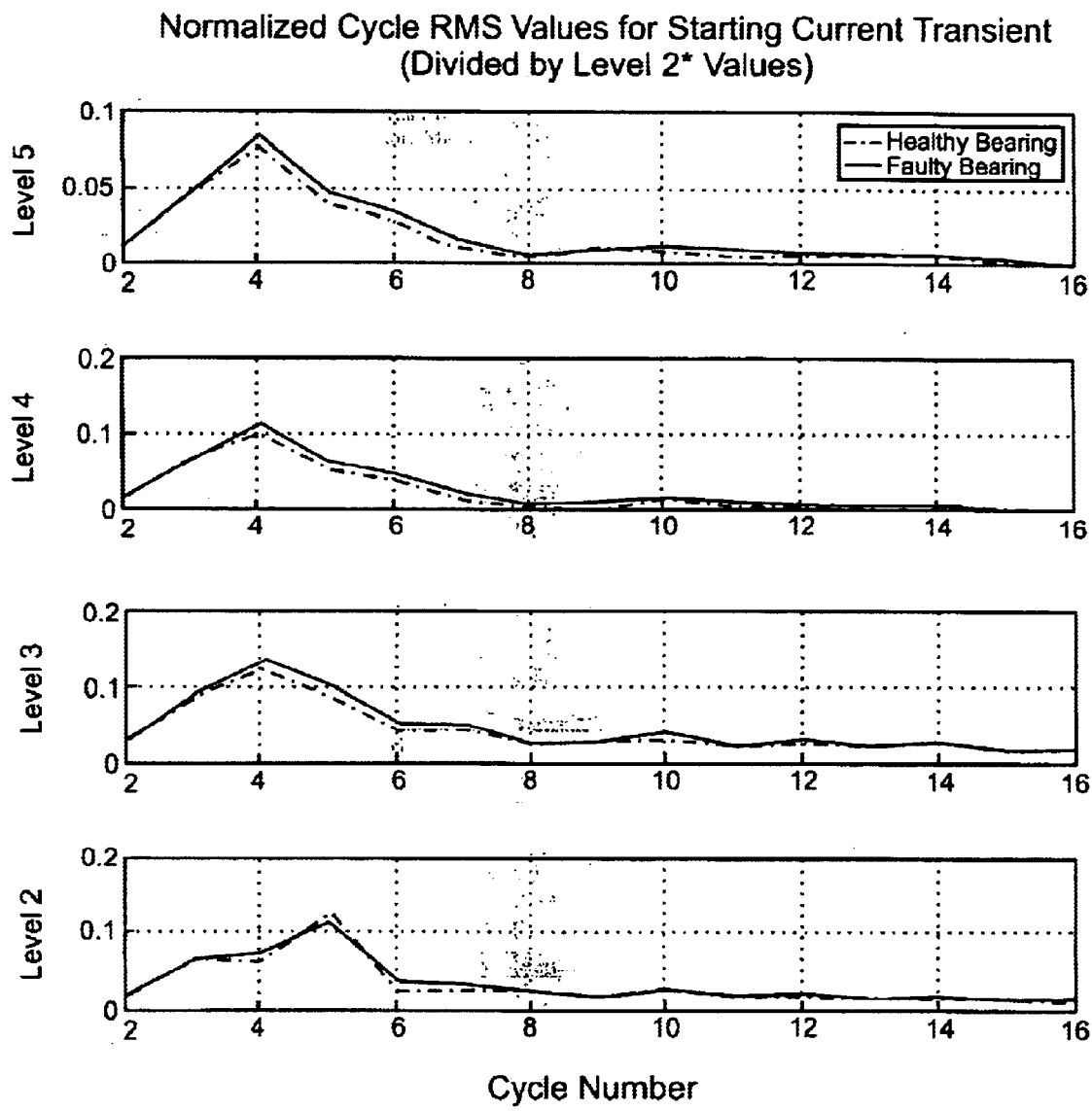
FIG. 8 shows a normalized current rms values for no load.

FIG. 8 depicts the normalized RMS values for the first 16 cycles. A comparison of the two plots indicates a substantial difference at the $4^{th}$ cycle for the upper three frequency bands.

Figure 9:
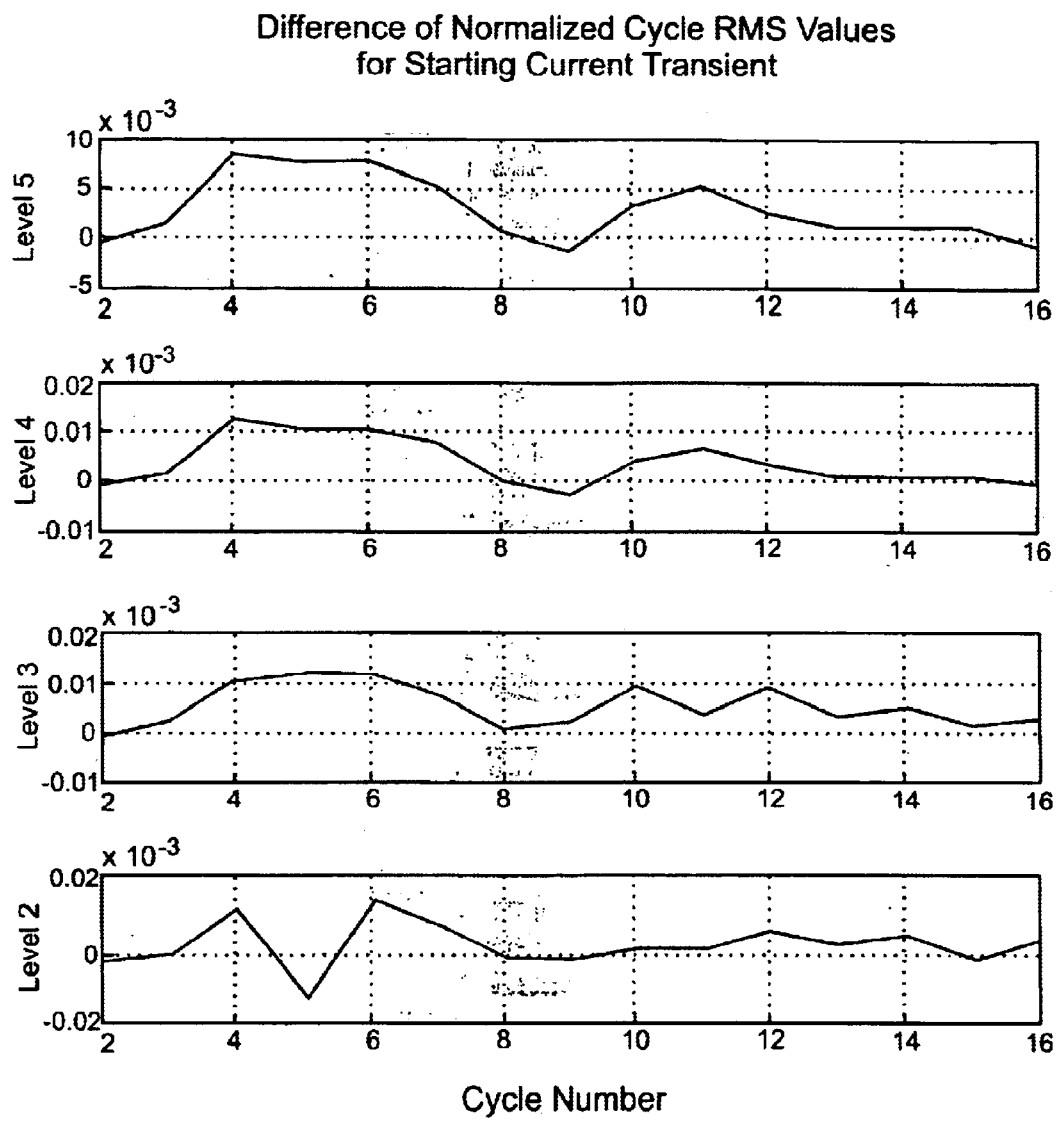
FIG. 9 shows the difference of normalized current rms values in the example of FIG. 7.

The difference of the normalized RMS values are plotted in FIG. 9. Basically, the normalized healthy bearing current RMS values are subtracted from the normalized faulty bearing current RMS values to obtain this plot.

In the analysis, data with similar voltage turn-on switching angles were used and any data displaying saturation in the first cycle due to initial iron magnetization were excluded.

The application of wavelet analysis to the start-up current transient is shown to provide a useful diagnostic for the detection of incipient bearing failure. Multi-function circuit monitors are finding increased use in monitoring individual motor loads. The start-up transient current data, they can provide, yields a useful predictive maintenance diagnostic when analyzed by the discrete wavelet transform. This monitoring, on each start, is achieved in a non-invasive manner and without the expense and inconvenience of additional transducers or specialized bearing diagnostic instruments.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method for detecting motor bearing defects, said method comprising:
   obtaining motor current transient data during motor start-up; and
   analyzing in a processor said motor current transient data to determine changes in RMS levels due to bearing defect-induced resonance.

2. The method of claim 1 and further including selecting data in one or more frequency bands.

3. The method of claim 1 wherein said analyzing comprises using a wavelet transform analysis.

4. The method of claim 1 wherein said analyzing comprises comparing the data to start-up data corresponding to a nondefective bearing.

5. The method of claim 1 wherein said analyzing comprises comparing data selected from two or more frequency sub-bands.

6. The method of claim 1 wherein said analyzing comprises determining a ratio of start-up RMS in one or more cycles to steady state RMS under different loading conditions of said motor bearing.

7. The method of claim 1 wherein said analyzing includes selecting a data occurring at one or more cycles of alternating current.

8. The method of claim 7 and further including selecting data in one or more frequency bands.

9. The method of claim 1 wherein said obtaining comprises obtaining motor current transient readings at a plurality of points per cycle of alternating current.

10. The method of claim 9 wherein said plurality of said points comprises 512 or more points.

11. An apparatus for detecting motor bearing defects, said apparatus comprising:
    means for obtaining motor current transient data during motor start-up; and
    means for analyzing in a processor said motor current transient data to determine whether changes in RMS levels are due to bearing defect-induced resonance.

12. The apparatus of claim 11 and further including means for selecting data in one or more frequency bands.

13. The apparatus of claim 11 wherein said means for analyzing uses a wavelet transform analysis.

14. The apparatus of claim 11 wherein said means for analyzing comprises means for comparing the data to start-up data corresponding to a nondefective bearing.

15. The apparatus of claim 11 wherein said means for analyzing comprises means for comparing data selected from two or more frequency sub-bands.

16. The apparatus of claim 11 wherein said means for analyzing comprises means for determining a ratio of start-up RMS in one or more cycles to steady state RMS under different loading conditions of said motor bearing.

17. The apparatus of claim 11 wherein said means for analyzing includes means for selecting data occurring at one or more cycles of alternating current.

18. The apparatus of claim 17 and further including means for selecting data in one or more frequency bands.

19. The apparatus of claim 11 wherein said means for obtaining comprises means for obtaining motor current transient readings at a plurality of points per cycle of alternating current.

20. The apparatus of claim 19 wherein said plurality of said points comprises 512 or more points.

21. A method for detecting motor bearing defects, said method comprising:
    obtaining motor current transient data during motor start-up;
    detecting motor bearing faults by analyzing in a processor said motor current transient data obtained during motor start-up; and
    determining using said processor deviations from baseline data representing motor current transient data obtained during start-up of a motor without bearing defects.

22. An apparatus for detecting motor bearing defects, said apparatus comprising:
    a circuit monitor capturing motor current transient data during motor start-up; and
    a processor mat receives said motor current transient data from said circuit monitor, said processor being programmed to detect motor bearing faults by analyzing said motor current transient data obtained during motor start-up for determining deviations from baseline data representing motor current transient data obtained during start-up of a motor without bearing defects.

* * * * *